(12) United States Patent
Coene

(10) Patent No.: US 6,404,355 B1
(45) Date of Patent: Jun. 11, 2002

(54) GENERATION OF A RUNLENGTH LIMITED DIGITAL INFORMATION SIGNAL

(75) Inventor: Willem M. J. Coene, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/408,790

(22) Filed: Sep. 30, 1999

(30) Foreign Application Priority Data

Oct. 1, 1998 (EP) ............................................. 98203325

(51) Int. Cl.$^7$ ................................................. H03M 7/00
(52) U.S. Cl. ............................................. 341/59; 341/58
(58) Field of Search ..................... 341/59, 56, 57, 341/155, 160, 161; 375/264

(56) References Cited

U.S. PATENT DOCUMENTS

| | | | |
|---|---|---|---|
| 5,477,222 A | | 12/1995 | Kahlman et al. ............... 341/95 |
| 5,537,112 A | | 7/1996 | Tsang ........................... 341/59 |
| 5,668,546 A | * | 9/1997 | McLaughlin et al. .......... 341/59 |
| 5,696,505 A | | 12/1997 | Immink ......................... 341/59 |
| 5,748,118 A | * | 5/1998 | McLaughlin et al. .......... 341/59 |
| 5,757,293 A | * | 5/1998 | McLaughlin et al. .......... 341/59 |
| 5,781,130 A | * | 7/1998 | McLaughlin et al. .......... 341/56 |

FOREIGN PATENT DOCUMENTS

EP         0420179 A2    3/1991    ........... G11B/20/14

OTHER PUBLICATIONS

"Run–Length–Limited Codes with Multiple Spacing", Paul Funk, IEEE Transaction on Magnetics, vol. Mag–18, No. 2, Mar. 1982, pp. 772–775.

* cited by examiner

Primary Examiner—Peguy Jeanpierre
Assistant Examiner—Joseph J Lauture
(74) Attorney, Agent, or Firm—Michael E. Belk

(57) ABSTRACT

An apparatus is disclosed for generating a runlength limited (RLL) digital information signal, the digital information signal having a minimum runlength of d' and a maximum runlength of k', d' and k' being integers larger than zero and where k' is larger than d'. In accordance with the invention, the apparatus is adapted to generate the runlength limited digital information signal, such that a minimum runlength in the digital information signal occurs isolated from other minimum runlengths in the digital information signal.

34 Claims, 2 Drawing Sheets

GENERATION OF A RUNLENGTH LIMITED DIGITAL INFORMATION SIGNAL

FIELD OF THE INVENTION

The invention is-related to the field of encoding digital information signals.

BACKGROUND OF THE INVENTION

The invention relates to an apparatus for generating a runlength limited (RLL) digital information signal, the digital information signal having a minimum runlength of d' and a maximum runlength of k', d' and k' being integers larger than zero and where k' is larger than d' and to a method for generating such runlength limited digital information signal. The invention further relates to an apparatus for and a method of generating a (d,k) sequence.

Those skilled in the art are directed to the following related documents:

(D1) U.S. Pat. No. 5,477,222 (PHN, 14.448)

(D2) K. A. Schouhamer Immink, Coding Techniques for Digital Recorders, Prentice Hall, 1991.

(D3) P. Funk; Run-Length-Limited Codes with MultipleSpacing, IEEE Transactions on Magnetics, Vol. MAG-18, 1982, pp. 772–775.

(D4) U.S. Pat. No. 5,696,505 (PHN 14.746).

An apparatus as defined in the opening paragraph is eg. known from U.S. Pat. No. 5,477,222, document D1 in the list of related documents.

Runlength limited digital information signals obtained from channel coding an information signal are described in the book coding techniques for digital records by K. A. Schouhamer Immink, Prentice Hall, 1991, chapter 5, document D2. Such runlength limited digital information signals are generally derived from so-called (d,k) constrained sequences. In such sequences, expressed in NRZ-I (non-return-to-zero-inverse) notation, two logical 'ones' in the sequence are separated bva run of consecutive 'zeros' of length at least d, and any run of consecutive 'zeros' is of length at moist k. A (d,k) sequence is normally converted in a precoding step so as to obtain the runlength limited information signal. In such runlength limited information signal obtained from the above (d,k) sequence, minimum runlengths of d+1 of consecutive like symbols occur and maximum runlengths of k+1 consecutive like symbols occur in sequences expressed in NRZ notation. This precoding of a (d,k) sequence, for d=1 and k=7 as an example, results in a runlength limited information signal having a minimum runlength of 2 and a maximum runlength of 8.

A choice of a specific channel code, properly adopted to the physical channel characteristics, is limited by the fact that the d-constraint is restricted to the natural numbers (d=0, d=1, d=2, . . . ). It has been proposed in the past to remove this limitation, by using rational d-constraints. Reference is made in this respect to the publication by P. Funk, document D3 in the list of related documents.

The above documents are hereby incorporated herein in whole by reference.

SUMMARY OF THE INVENTION

The invention has for its object to provide a different alternative for an apparatus which is capable of generating channel codes which fill up the gap between d and d+1 for the traditional (d,k)-based codes.

In accordance with a first aspect of the invention, the channel code generating apparatus is adapted to generate the runlength limited digital information signal, such that a minimum runlength in the digital information signal occurs isolated from other minimum runlengths in the digital information signal.

In accordance with a second aspect of the invention, the channel code generating apparatus for generating a runlength limited digital information signal, the digital information signal having a minimum runlength of d' and a maximum runlength of k', d' and k' being integers larger than zero and where k' is larger than d'. Also, the channel code generating apparatus is adapted to generate the runlength limited digital information signal, such that a minimum runlength occurring in the digital information signal follows only a directly precedingrunlength larger than d'.

In accordance with a third aspect of the invention, the channel code generating apparatus for generating a runlength limited digital information signal, the digital information signal having a specific minimum runlength and a maximum runlength of k', the apparatus including first apparatus for generating runlengths in the digital information signal of length d'+1 at minimum, where d' and k' are integers larger than zero and where k' is larger than d'+1. Also, the channel code generating apparatus further includes second apparatus for generating runlengths of d' in the runlength limited digital information signal, such that such runlengths of d' occur isolated from other such runlengths of d' in the digital information signal.

In accordance with a fourth aspect of the invention, the channel code generating apparatus is adapted for generating a runlength limited digital information signal, the digital information signal having a specific minimum runlength and a maximum runlength of k', the channel code generating apparatus including first apparatus comprising means for generating runlengths in the digital information signal of length d'+1, where d' and k' are integers larger than zero and where k' is larger than d'+1. Also, the channel code generating apparatus further includes second apparatus for generating runlengths of d' in the runlength limited digital information signal, such that such runlengths of d' occur only following a directly preceding runlength larger than d'.

The invention generates (d,k)-based RLL channel codes, with the additional allowance of isolated Id runlengths (that is: isolated runlengths of length d), which are normally forbidden in a pure (d,k) code. An isolated Id runlength has to be surrounded by two other runlengths In with n>d. In contrast, for a pure (d−1,k) RLL channel code, the appearance of Id's is unconditional. Therefore, the capacity of the new (d,k) code with isolated Id's (called for short an iso-Id(d,k) code), is between the capacity of the traditional (d,k) and (d−1,k) channel codes. The increase in capacity of the iso-Id(d,k) code compared to the pure (d,k)-code, goes together with an increase in the highest frequency in the bit-sequence, which equals 1/(2d+1) for the iso-(d,k) code, which is between 1/(2d+2) and 1/2d (for the pure (d,k) and (d−1,k) codes, respectively).

It is to be understood that, where the claims define a RLL digital information signal with a minimum runlength of d', d' should be taken equal to the parameter d introduced above, in order to bring the claims in conformity with the above argumentation.

BRIEF DESCRIPTION OF THE DRAWINGS

These and other objects of the invention will be elucidated below in the following figure description, in which.

DETAILED DESCRIPTIONS

In the following figure description, practical examples are worked out for a number of channel codes.

Iso-Id(d,k) code implementations with mapping of n user bits to m channel bits, have been constructed with the parity preserving property, so that DC-control can be applied. Reference is made in this respect to U.S. Pat. No. 5,477,222, document D1 in the list of related documents. Parity preserving implies that user words of n bits long, and channel words of m bits long, have the same parity (which is the number of 1's in a word, modulo 2). This property must also hold for the substitution encoding tables of the code (with 2n-to-2m mapping), which are used when runlength violations appear upon concatenation of channel words by use of the standard encoding tables (with n-to-m mapping).

Figure 1:
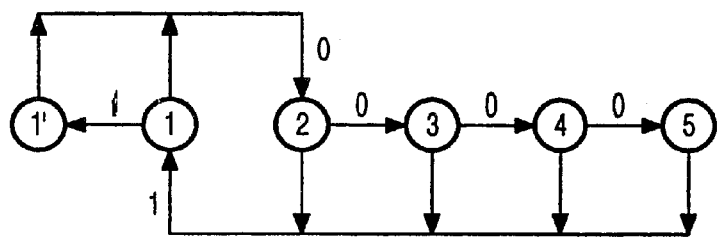
FIG. 1 shows a state-transition diagram for an iso-I1(d=1,k=4) code.

Next a Rate R=4/5, iso-I1(d=1,k=4) Code will be described. The Finite-State Runlength Diagram of the code is shown in FIG. 1. The states numbered 1 to 5 in the state diagram of FIG. 1 describe the normal (d=1,k=4) code. By going from the state 1 to the state 2 and back to the state 1, a sequence...01010...is obtained, which is a representation of the d(=1) constraint. That is: at minimum one 'zero' occurs between two subsequent 'ones' in the sequence, expressed in NRZ-I notation. Further, by going through the states numbered 1, 2, 3, 4, 5 and back to the state 1, a sequence...01000010...is generated, which represents the k constraint: four 'zeroes' at most occur between two consecutive 'ones' in the sequence. It can be seen that, upon 1T precoding this NRZ-I sequence, a runlength limited sequence is obtained having runlengths of at minimum 2 and at maximum 5 runs of consecutive like symbols (in NRZ notation), or...+--- ++...and...+-----+..., respectively.

It can further be seen that, apart from the traditional runlength constraints on the number of successive zeroes, there is now also a constraint on the number of successive ones, which should not exceed 2. This is realized by adding the state numbered 1'. By going through one of the states numbered 2, 3, 4 or 5, via the state 1 and the state 1', and going back to the state 2, a sequence...0110.... has been obtained. Upon 1T precoding, this results in the occurrence of a run of 1, or ...++-++....

The capacity of the iso-I1(d=1,k=4) code equals C=0.8376. The code implementation has a rate R=0.8, thus yielding a code efficiency of 95.5%. An iso-I1(d=1,k=3) code, which has a more severe constraint on k, leads to a capacity of C=0.7947. Such code can thus not be realised with a 4-to-5 mapping.

The standard conversion rules for the iso-I1(d=1,k=4) code are shown in table I A and table I B. The table I A is the conversion table for the conversion of the even parity words and the table I B is the conversion table for the odd parity words.

TABLE I A

Standard encoding table for even-parity channel words of iso-I1 (d=1, k=4) code.

|   | 4-bit input word | 5-bit channel word |
|---|---|---|
| 1. | 0000 | 00011 |
| 2. | 0011 | 00101 |
| 3. | 0110 | 00110 |
| 4. | 1100 | 01001 |
| 5. | 0101 | 01010 |
| 6. | 1010 | 01100 |
| 7. | 1001 | 10010 |
| 8. | 1111 | 10100 |

TABLE I B

Standard encoding table for odd-parity channel words of iso-I1 (d=1, k=4) code.

|   | 4-bit input word | 5-bit channel word |
|---|---|---|
| 1. | 0001 | 00010 |
| 2. | 0010 | 00100 |
| 3. | 0100 | 01000 |
| 4. | 1000 | 01011 |
| 5. | 1110 | 01101 |
| 6. | 1101 | 10011 |
| 7. | 1011 | 10101 |
| 8. | 0111 | 10110 |

Further, substitution tables are needed to maintain the various constraints across the boundaries of consecutive converted words. The table II A corrects for the runlength violation otherwise occurring when concatenating some of the even parity input words, more specifically when concatenating the input words numbered 1 and 7, or when concatenating the input words 1 and 8, or when concatenating the input words 6 and 1 or when concatenating the input words 8 and 1, of the table I A. The middle column in the table II A shows that the runlength violations are in the form of three directly successive 'ones' or in the form of five directly successive 'zeroes', assuming the conversion in accordance with the rules of the table I A would have been carried out. The right column gives the substitution sequence. It should be noted that the second 5-bit word in the substitution table is not included in the converted words of the tables I A and I B. Therefore, those words can be used as an identification, upon decoding, that the two 5-bit converted words should be reconverted in accordance with the table II A.

Table II B corrects for the runlength violation otherwise occurring when concatenating some of the even parity input words from the table I A with some of the odd parity input words from the table I B. Table II C corrects for the runlength violation otherwise occurring when concatenating some of the odd parity input words from the table I B with some of the even parity input words from the table I A. Table II D corrects for the runlength violation otherwise occurring when concatenating some of the odd parity input words from the table I B.

TABLE II A

Substitution encoding table: EE-concatenation of iso-I1 (d=1, k=4) code.

|   | EE-indices | original concatenation | substitution |
|---|---|---|---|
| 1. | 1 // 7 | 00011 10010 | 00101 10001 |
| 2. | 1 // 8 | 00011 10100 | 00100 11001 |
| 3. | 6 // 1 | 01100 00011 | 01001 10001 |
| 4. | 8 // 1 | 10100 00011 | 10100 10001 |

TABLE II B

Substitution encoding table: EO-concatenation of iso-I1 (d=1, k=4) code.

|   | EO-indices | original concatenation | substitution |
|---|---|---|---|
| 1. | 1 // 6 | 0001110011 | 0010100001 |
| 2. | 1 // 7 | 0001110101 | 0011011001 |
| 3. | 1 // 8 | 0001110110 | 0011011010 |

TABLE II B-continued

Substitution encoding table: EO-concatenation of iso-I1 (d=1, k=4) code.

| | EO-indices | original concatenation | substitution |
|---|---|---|---|
| 4. | 6 // 1 | 0110000010 | 0110011010 |
| 5. | 8 // 1 | 1010000010 | 1010011010 |

TABLE II C

Substitution encoding table: OE-concatenation of iso-I1 (d=1, k=4) code.

| | OE-indices | original concatenation | substitution |
|---|---|---|---|
| 1. | 2 // 1 | 00100 00011 | 00100 10001 |
| 2. | 3 // 1 | 01000 00011 | 01000 10001 |
| 3. | 3 // 2 | 01000 00101 | 01010 11001 |
| 4. | 3 // 3 | 01000 00110 | 01010 11010 |
| 5. | 4 // 7 | 01011 10010 | 01100 11001 |
| 6. | 4 // 8 | 01011 10100 | 01101 10001 |
| 7. | 6 // 7 | 10011 10010 | 10010 11010 |
| 8. | 6 // 8 | 10011 10100 | 10110 10001 |

TABLE II D

Substitution encoding table: OO-concatenation of iso-I1 (d=1, k=4) code.

| | OO-indices | original concatenation | substitution |
|---|---|---|---|
| 1. | 2 // 1 | 00100 00011 | 00100 10001 |
| 2. | 3 // 1 | 01000 00010 | 01000 11001 |
| 3. | 3 // 2 | 01000 00100 | 01000 11010 |
| 4. | 4 // 6 | 01011 10011 | 01101 00001 |
| 5. | 4 // 7 | 01011 10101 | 01010 10001 |
| 6. | 4 // 8 | 01011 10110 | 01100 10001 |
| 7. | 6 // 6 | 10011 10011 | 10110 11001 |
| 8. | 6 // 7 | 10011 10101 | 10110 11010 |
| 9. | 6 // 8 | 10011 10110 | 10010 10001 |

Summarizing, the advantages of the R=4/5 iso-I1(d=1,k=4) code are:
- standard mapping (4-to-5) and substitutional mapping (8-to-10) compatible with byte-oriented error correction, and error-propagation only occurs when the substitution tables during decoding involve two successive bytes
- low k-value, thus limited intersymbol-interference (ISI), and proper clocking.
- DC-control via parity preserve principle.
- relatively simple encoding tables.

Figure 2:
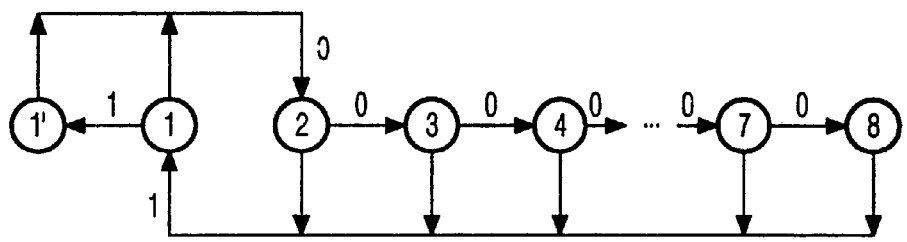
FIG. 2 shows the state-transition diagram for an iso-I1 (d=1,k=7) code.

Next, a Rate R=6/7 iso-I1(d=1,k=7) code will be described. The finite-state runlength diagram of the code is shown in FIG. 2. The states numbered 1 to 8 in the state diagram of FIG. 2 describe the normal (d=1,k=7) code. By going from the state 1 to the state 2 and back to the state 1, a sequence ...01010... is obtained, which is a representation of the d(=1) constraint. That is: at minimum one 'zero' occurs between two subsequent 'ones' in the sequence, expressed in NRZ-I notation. Further, by going through the states numbered 1, 2, 3, ......., 7, 8 and back to the state 1, a sequence ...01000000010... is generated, which represents the k constraint: seven 'zeroes' at most occur between two consecutive 'ones' in the sequence. It can be seen that, upon 1T precoding this NRZ-I sequence, a runlength limited sequence is obtained having runlengths of at minimum 2 and at maximum 8 runs of consecutive like symbols (in NRZ notation), or ...+--+... and ...+--------+.. , respectively.

It can further be seen that, apart from the traditional runlength constraints on the number of successive zeroes, there is now also a constraint on the number of successive ones, which should not exceed 2. This is realized by adding the state numbered 1'. By going through one of the states numbered 2, 3, 4 or 5, via the state 1 and the state 1', and going back to the state 2, a sequence ....0110.... has been obtained. Upon 1T preceding, this results in the occurrence of a run of 1.

The capacity of the RLL code equals C=0.8732. The code implementation has a rate R=0.8571, thus yielding a code efficiency of 98.2%.

The standard encoding rules for the code is shown in the tables III A and III B. The table III A discloses the conversion of even parity input words into converted words and the table III B discloses the conversion of the odd parity input words.

TABLE III A

Standard encoding table for even-parity words for iso-I2 (d=1, k=7) code.

| | 4-bit input word | 5-bit channel word |
|---|---|---|
| 1. | 000000 | 0000101 |
| 2. | 000011 | 0000110 |
| 3. | 000101 | 0001001 |
| 4. | 001001 | 0001010 |
| 5. | 010001 | 0001100 |
| 6. | 100001 | 0010001 |
| 7. | 000110 | 0010010 |
| 8. | 001010 | 0010100 |
| 9. | 010010 | 0011000 |
| 10. | 100010 | 0011011 |
| 11. | 001100 | 0100001 |
| 12. | 010100 | 0100010 |
| 13. | 100100 | 0100100 |
| 14. | 011000 | 0101000 |
| 15. | 101000 | 0101011 |
| 16. | 110000 | 0101101 |
| 17. | 001111 | 0110000 |
| 18. | 010111 | 0110011 |
| 19. | 011011 | 0110101 |
| 20. | 011101 | 0110110 |
| 21. | 011110 | 1000001 |
| 22. | 100111 | 1000010 |
| 23. | 101011 | 1000100 |
| 24. | 101101 | 1001000 |
| 25. | 101110 | 1001011 |
| 26. | 110011 | 1001101 |
| 27. | 110101 | 1010000 |
| 28. | 110110 | 1010011 |
| 29. | 111001 | 1010101 |
| 30. | 111010 | 1010110 |
| 31. | 111100 | 1011001 |
| 32. | 111111 | 1011010 |

TABLE III B

Standard encoding table for odd-parity words for iso-I2 (d=1, k=7) code.

| | 6-bit input word | 7-bit channel word |
|---|---|---|
| 1. | 000001 | 0000010 |
| 2. | 000010 | 0000100 |
| 3. | 000100 | 0001000 |
| 4. | 001000 | 0001011 |
| 5. | 010000 | 0001101 |
| 6. | 10000o | 0010000 |
| 7. | 000111 | 0010011 |
| 8. | 001011 | 0010101 |
| 9. | 010011 | 0010110 |
| 10. | 100011 | 0011001 |
| 11. | 001101 | 0011010 |
| 12. | 010101 | 0100000 |

TABLE III B-continued

Standard encoding table for odd-parity words for iso-I2 (d=1, k=7) code.

| | 6-bit input word | 7-bit channel word |
|---|---|---|
| 13. | 100101 | 0100011 |
| 14. | 011001 | 0100101 |
| 15. | 101001 | 0100110 |
| 16. | 110001 | 0101001 |
| 17. | 001110 | 0101010 |
| 18. | 010110 | 0101100 |
| 19. | 100110 | 0110001 |
| 20. | 011010 | 0110010 |
| 21. | 101010 | 0110100 |
| 22. | 110010 | 1000011 |
| 23. | 011100 | 1000101 |
| 24. | 101100 | 1000110 |
| 25. | 110100 | 1001001 |
| 26. | 111000 | 1001010 |
| 27. | 011111 | 1001100 |
| 28. | 101111 | 1010001 |
| 29. | 110111 | 1010010 |
| 30. | 111011 | 1010100 |
| 31. | 111101 | 1011000 |
| 32. | 111110 | 1011011 |

Further, the runlength violation problems which would arise upon free concatenation by the standard table, are removed by the substitution tables, shown in the table IV A to IV D, where the table IV A solves the problem when concatenating even parity input words from the table III A, the table IV B solves the problem when concatenating even parity words from the table III A with odd parity input words from the table III B, the table IV C solves the problem when concatenating odd parity input words from the table III B with even parity input words from the table III A and the table IV D solves the problem when concatenating odd parity words from the table III B.

TABLE IV A

Substitution encoding table: EE-concatenation for iso-I1 (d=1, k=7) code.

| | EE-indices | original concatenation | substitution |
|---|---|---|---|
| 1. | 10 // 21 | 0011011 1000001 | 0010010 1100101 |
| 2. | 10 // 22 | 0011011 1000010 | 0010010 1100110 |
| 3. | 10 // 23 | 0011011 1000100 | 0010010 1101001 |
| 4. | 10 // 24 | 0011011 1001000 | 0010010 1101010 |
| 5. | 10 // 25 | 0011011 1001011 | 0010010 1101100 |
| 6. | 10 // 20 | 0011011 1001101 | 0010100 1100101 |
| 7. | 10 // 27 | 0011011 1010000 | 0010100 1100110 |
| 8. | 10 // 28 | 0011011 1010011 | 0010100 1101001 |
| 9. | 10 // 29 | 0011011 1010101 | 0010100 1101010 |
| 10. | 10 // 30 | 0011011 1010110 | 0010100 1101100 |
| 11. | 10 // 31 | 0011011 1011001 | 0011000 110010 |
| 12. | 10 // 32 | 0011011 1011010 | 0011000 1100110 |
| 13. | 15 // 21 | 0101011 1000001 | 0100010 1100101 |
| 14. | 15 // 22 | 0101011 1000010 | 0100010 1100110 |
| 15. | 15 // 23 | 0101011 1000100 | 0100010 1101001 |
| 16. | 15 // 24 | 0101011 1001000 | 0100010 1101010 |
| 17. | 15 // 25 | 0101011 1001011 | 0100010 1101100 |
| 18. | 15 // 20 | 0101011 1001101 | 0100100 1100101 |
| 19. | 15 // 27 | 0101011 1010000 | 0100100 1100110 |
| 20. | 15 // 28 | 0101011 1010011 | 0100100 1101001 |
| 21. | 15 // 29 | 0101011 1010101 | 0100100 1101010 |
| 22. | 15 // 30 | 0101011 1010110 | 0100100 1101100 |
| 23. | 15 // 31 | 0101011 1011001 | 0101000 1100101 |
| 24. | 15 // 32 | 0101011 1011010 | 0101000 1100110 |
| 25. | 17 // 1 | 0110000 0000101 | 0101000 1101001 |
| 26. | 17 // 2 | 0110000 0000110 | 0101000 1101010 |
| 27. | 18 // 21 | 0110011 1000001 | 0101000 1101100 |
| 28. | 18 // 22 | 0110011 1000010 | 0110000 1100101 |
| 29. | 18 // 23 | 0110011 1000100 | 0110000 1100110 |
| 30. | 18 // 24 | 0110011 1001000 | 0110000 1101001 |
| 31. | 18 // 25 | 0110011 1001011 | 0110000 1101010 |
| 32. | 18 // 20 | 0110011 1001101 | 0110000 1101100 |
| 33. | 18 // 27 | 0110011 1010000 | 0110110 1100101 |
| 34. | 18 // 28 | 0110011 1010011 | 0110110 1100110 |
| 35. | 18 // 29 | 0110011 1010101 | 0110110 1101001 |
| 36. | 18 // 30 | 0110011 1010110 | 0110110 1101010 |
| 37. | 18 // 31 | 0110011 1011001 | 0110110 1101100 |
| 38. | 18 // 32 | 0110011 1011010 | 0100110 1100001 |
| 39. | 25 // 21 | 1001011 1000001 | 1000100 1100101 |
| 40. | 25 // 22 | 1001011 1000010 | 1000100 1100110 |
| 41. | 25 // 23 | 1001011 1000100 | 1000100 1101001 |
| 42. | 25 // 24 | 1001011 1001000 | 1000100 1101010 |
| 43. | 25 // 25 | 1001011 1001011 | 1000100 1101100 |
| 44. | 25 // 20 | 1001011 1001101 | 1001000 1100101 |
| 45. | 25 // 27 | 1001011 1010000 | 1001000 1100110 |
| 46. | 25 // 28 | 1001011 1010011 | 1001000 1101001 |
| 47. | 25 // 29 | 1001011 1010101 | 1001000 1101010 |
| 48. | 25 // 30 | 1001011 1010110 | 1001000 1101100 |
| 49. | 25 // 31 | 1001011 1011001 | 1010000 1100101 |
| 50. | 25 // 32 | 1001011 1011010 | 1010000 1100110 |
| 52. | 27 // 2 | 1010000 0000110 | 1010000 1101010 |
| 53. | 28 // 21 | 1010011 1000001 | 1010000 1101100 |
| 54. | 28 // 22 | 1010011 1000010 | 1010110 1100101 |
| 55. | 28 // 23 | 1010011 1000100 | 1010110 1100110 |
| 56. | 28 // 24 | 1010011 1001000 | 1010110 1101001 |
| 57. | 28 // 25 | 1010011 1001011 | 1010110 1101010 |
| 58. | 28 // 20 | 1010011 1001101 | 1010110 1101100 |
| 59. | 28 // 27 | 1010011 1010000 | 1011010 1100101 |
| 60. | 28 // 28 | 1010011 1010011 | 1011010 1100110 |
| 61. | 28 // 29 | 1010011 1010101 | 1011010 1101001 |
| 62. | 28 // 30 | 1010011 1010110 | 1011010 1101010 |
| 63. | 28 // 31 | 1010011 1011001 | 1011010 1101100 |
| 64. | 28 // 32 | 1010011 1011010 | 1000110 1100001 |

TABLE IV B

Substitution encoding table: EO-concatenation for iso-I1 (d=1, k=7) code.

| | EO-indices | original concatenation | substitution |
|---|---|---|---|
| 1. | 9 // 1 | 0011000 0000010 | 0010010 1100001 |
| 2. | 10 // 22 | 0011011 1000011 | 0010010 1100010 |
| 3. | 10 // 23 | 0011011 1000101 | 0010010 1100100 |
| 4. | 10 // 24 | 0011011 1000110 | 0010010 1101101 |
| 5. | 10 // 25 | 0011011 1001001 | 0010100 1100001 |
| 6. | 10 // 20 | 0011011 1001010 | 0010100 1100010 |
| 7. | 10 // 27 | 0011011 1001100 | 0010100 1100100 |
| 8. | 10 // 28 | 0011011 1010001 | 0010100 1101101 |
| 9. | 10 // 29 | 0011011 1010010 | 0011000 1100001 |
| 10. | 10 // 30 | 0011011 1010100 | 0011000 1100010 |
| 11. | 10 // 31 | 0011011 1011000 | 0011000 1100100 |
| 12. | 10 // 32 | 0011011 1011011 | 0011000 1101101 |
| 13. | 14 // 1 | 0101000 0000010 | 0100010 1100001 |
| 14. | 15 // 22 | 0101011 1000011 | 0100010 1100010 |
| 15. | 15 // 23 | 0101011 1000101 | 0100010 1100100 |
| 16. | 15 // 24 | 0101011 1000110 | 0100010 1101101 |
| 17. | 15 // 25 | 0101011 1001001 | 0100100 1100001 |
| 18. | 15 // 20 | 0101011 1001010 | 0100100 1100010 |
| 19. | 15 // 27 | 0101011 1001100 | 0100100 1100100 |
| 20. | 15 // 28 | 0101011 1010001 | 0100100 1101101 |
| 21. | 15 // 29 | 0101011 1010010 | 0101000 1100001 |
| 22. | 15 // 30 | 0101011 1010100 | 0101000 1100010 |
| 23. | 15 // 31 | 0101011 1011000 | 0101000 1100100 |
| 24. | 15 // 32 | 0101011 1011011 | 0101000 1101101 |
| 25. | 17 // 1 | 0110000 0000010 | 0110000 1100001 |
| 26. | 17 // 2 | 0110000 0000100 | 0110000 1100010 |
| 27. | 18 // 22 | 0110011 1000011 | 0110000 1100100 |
| 28. | 18 // 23 | 0110011 1000101 | 0110000 1101101 |
| 29. | 18 // 24 | 0110011 1000110 | 0110110 1100001 |

TABLE IV B-continued

Substitution encoding table: EO-concatenation for iso-I1 (d=1, k=7) code.

| | EO-indices | original concatenation | substitution |
|---|---|---|---|
| 30. | 18 // 25 | 0110011 1001001 | 0110110 1100010 |
| 31. | 18 // 20 | 0110011 1001010 | 0110110 1100100 |
| 32. | 18 // 27 | 0110011 1001100 | 0110110 1101101 |
| 33. | 18 // 28 | 0110011 1010001 | 0100110 1100101 |
| 34. | 18 // 29 | 0110011 1010010 | 0100110 1100110 |
| 35. | 18 // 30 | 0110011 1010100 | 0100110 1101001 |
| 36. | 18 // 31 | 0110011 1011000 | 0100110 1101010 |
| 37. | 18 // 32 | 0110011 1011011 | 0100110 1101100 |
| 38. | 24 // 1 | 1001000 0000010 | 1000100 1100001 |
| 39. | 25 // 22 | 1001011 1000011 | 1000100 1100010 |
| 40. | 25 // 23 | 1001011 1000101 | 1000100 1100100 |
| 41. | 25 // 24 | 1001011 1000110 | 1000100 1101101 |
| 42. | 25 // 25 | 1001011 1001001 | 1001000 1100001 |
| 43. | 25 // 20 | 1001011 1001010 | 1001000 1100010 |
| 44. | 25 // 27 | 1001011 1001100 | 1001000 1100100 |
| 45. | 25 // 28 | 1001011 1010001 | 1001000 1101101 |
| 46. | 25 // 29 | 1001011 1010010 | 1010000 1100001 |
| 47. | 25 // 30 | 1001011 1010100 | 1010000 1100010 |
| 48. | 25 // 31 | 1001011 1011000 | 1010000 1100100 |
| 49. | 25 // 32 | 1001011 1011011 | 1010000 1101101 |
| 50. | 27 // 1 | 1010000 0000010 | 1010110 1100001 |
| 51. | 27 // 2 | 1010000 0000100 | 1010110 1100010 |
| 52. | 28 // 22 | 1010011 1000011 | 1010110 1100100 |
| 53. | 28 // 23 | 1010011 1000101 | 1010110 1101101 |
| 54. | 28 // 24 | 1010011 1000110 | 1011010 1100001 |
| 55. | 28 // 25 | 1010011 1001001 | 1011010 1100010 |
| 56. | 28 // 20 | 1010011 1001010 | 1011010 1100100 |
| 57. | 28 // 27 | 1010011 1001100 | 1011010 1101101 |
| 58. | 28 // 28 | 1010011 1010001 | 1000110 1100101 |
| 59. | 28 // 29 | 1010011 1010010 | 1000110 1100110 |
| 60. | 28 // 30 | 1010011 1010100 | 1000110 1101001 |
| 61. | 28 // 31 | 1010011 1011000 | 1000110 1101010 |
| 62. | 28 // 32 | 1010011 1011011 | 1000110 1101100 |

TABLE IV C

Substitution encoding table: OE-concatenation for iso-I1 (d=1, k=7) code.

| | OE-indices | original concatenation | substitution |
|---|---|---|---|
| 1. | 4 // 21 | 0001011 1000001 | 0001010 1100001 |
| 2. | 4 // 22 | 0001011 1000010 | 0001010 1100010 |
| 3. | 4 // 23 | 0001011 1000100 | 0001010 1100100 |
| 4. | 4 // 24 | 0001011 1001000 | 0001010 1101101 |
| 5. | 4 // 25 | 0001011 1001011 | 0001100 1100001 |
| 6. | 4 // 20 | 0001011 1001101 | 0001100 1100010 |
| 7. | 4 // 27 | 0001011 1010000 | 0001100 1100100 |
| 8. | 4 // 28 | 0001011 1010011 | 0001100 1101101 |
| 9. | 4 // 29 | 0001011 1010101 | 0001000 1100101 |
| 10. | 4 // 30 | 0001011 1010110 | 0001000 1100110 |
| 11. | 4 // 31 | 0001011 1011001 | 0001000 1101001 |
| 12. | 4 // 32 | 0001011 1011010 | 0001000 1101010 |
| 13. | 6 // 1 | 0010000 0000101 | 0010000 1100101 |
| 14. | 6 // 2 | 0010000 0000110 | 0010000 1100110 |
| 15. | 7 // 21 | 0010011 1000001 | 0010000 1101001 |
| 16. | 7 // 22 | 0010011 1000010 | 0010000 1101010 |
| 17. | 7 // 23 | 0010011 1000100 | 0010000 1101101 |
| 18. | 7 // 24 | 0010011 1001000 | 0010110 1100101 |
| 19. | 7 // 25 | 0010011 1001011 | 0010110 1100110 |
| 20. | 7 // 20 | 0010011 1001101 | 0010110 1101001 |
| 21. | 7 // 27 | 0010011 1010000 | 0010110 1101010 |
| 22. | 7 // 28 | 0010011 1010011 | 0010110 1101100 |
| 23. | 7 // 29 | 0010011 1010101 | 0011010 1100101 |
| 24. | 7 // 30 | 0010011 1010110 | 0011010 1100110 |
| 25. | 7 // 31 | 0010011 1011001 | 0011010 1101001 |
| 26. | 7 // 32 | 0010011 1011010 | 0011010 1101010 |
| 27. | 12 // 1 | 0100000 0000101 | 0101010 1100101 |
| 28. | 12 // 2 | 0100000 0000110 | 0101010 1100110 |
| 29. | 12 // 3 | 0100000 0001001 | 0101010 1101001 |
| 30. | 12 // 4 | 0100000 0001010 | 0101010 1101010 |

TABLE IV C-continued

Substitution encoding table: OE-concatenation for iso-I1 (d=1, k=7) code.

| | OE-indices | original concatenation | substitution |
|---|---|---|---|
| 31. | 12 // 5 | 0100000 0001100 | 0101010 1101100 |
| 32. | 13 // 21 | 0100011 1000001 | 0101100 1100101 |
| 33. | 13 // 22 | 0100011 1000010 | 0101100 1100110 |
| 34. | 13 // 23 | 0100011 1000100 | 0101100 1101001 |
| 35. | 13 // 24 | 0100011 1001000 | 0101100 1101010 |
| 36. | 13 // 25 | 0100011 1001011 | 0101100 1101100 |
| 37. | 13 // 20 | 0100011 1001101 | 0110010 1100101 |
| 38. | 13 // 27 | 0100011 1010000 | 0110010 1100110 |
| 39. | 13 // 28 | 0100011 1010011 | 0110010 1101001 |
| 40. | 13 // 29 | 0100011 1010101 | 0110010 1101010 |
| 41. | 13 // 30 | 0100011 1010110 | 0110010 1101100 |
| 42. | 13 // 31 | 0100011 1011001 | 0110100 1100101 |
| 43. | 13 // 32 | 0100011 1011010 | 0110100 1100110 |
| 44. | 22 // 21 | 1000011 1000001 | 1001010 1100101 |
| 45. | 22 // 22 | 1000011 1000010 | 1001010 1100110 |
| 46. | 22 // 23 | 1000011 1000100 | 1001010 1101001 |
| 47. | 22 // 24 | 1000011 1001000 | 1001010 1101010 |
| 48. | 22 // 25 | 1000011 1001011 | 1001010 1101100 |
| 49. | 22 // 20 | 1000011 1001101 | 1001100 1100101 |
| 50. | 22 // 27 | 1000011 1010000 | 1001100 1100110 |
| 51. | 22 // 28 | 1000011 1010011 | 1001100 1101001 |
| 52. | 22 // 29 | 1000011 1010101 | 1001100 1101010 |
| 53. | 22 // 30 | 1000011 1010110 | 1001100 1101100 |
| 54. | 22 // 31 | 1000011 1011001 | 1010010 1100101 |
| 55. | 22 // 32 | 1000011 1011010 | 1010010 1100110 |
| 56. | 32 // 21 | 1011011 1000001 | 1010010 1101001 |
| 57. | 32 // 22 | 1011011 1000010 | 1010010 1101010 |
| 58. | 32 // 23 | 1011011 1000100 | 1010010 1101100 |
| 59. | 32 // 24 | 1011011 1001000 | 1010100 1100101 |
| 60. | 32 // 25 | 1011011 1001011 | 1010100 1100110 |
| 61. | 32 // 20 | 1011011 1001101 | 1010100 1101001 |
| 62. | 32 // 27 | 1011011 1010000 | 1010100 1101010 |
| 63. | 32 // 28 | 1011011 1010011 | 1010100 1101100 |
| 64. | 32 // 29 | 1011011 1010101 | 1011000 1100101 |
| 65. | 32 // 30 | 1011011 1010110 | 1011000 1100110 |
| 66. | 32 // 31 | 1011011 1011001 | 1011000 1101001 |
| 67. | 32 // 32 | 1011011 1011010 | 1011000 1101010 |

TABLE IV D

Substitution encoding table: OO-concatenation for iso-I1 (d=1, k=7) code.

| | OO-indices | original concatenation | substitution |
|---|---|---|---|
| 1. | 3 // 1 | 0001000 0000010 | 0001010 1100101 |
| 2. | 4 // 22 | 0001011 1000011 | 0001010 1100110 |
| 3. | 4 // 23 | 0001011 1000101 | 0001010 1101001 |
| 4. | 4 // 24 | 0001011 1000110 | 0001010 1101010 |
| 5. | 4 // 25 | 0001011 1001001 | 0001010 1101100 |
| 6. | 4 // 20 | 0001011 1001010 | 0001100 1100101 |
| 7. | 4 // 27 | 0001011 1001100 | 0001100 1100110 |
| 8. | 4 // 28 | 0001011 1010001 | 0001100 1101001 |
| 9. | 4 // 29 | 0001011 1010010 | 0001100 1101010 |
| 10. | 4 // 30 | 0001011 1010100 | 0001100 1101100 |
| 11. | 4 // 31 | 0001011 1011000 | 0001000 1100001 |
| 12. | 4 // 32 | 0001011 1011011 | 0001000 1100010 |
| 13. | 6 // 1 | 0010000 0000010 | 0011000 1101001 |
| 14. | 6 // 2 | 0010000 0000100 | 0011000 1101010 |
| 15. | 7 // 22 | 0010011 1000011 | 0011000 1101100 |
| 16. | 7 // 23 | 0010011 1000101 | 0010000 1100001 |
| 17. | 7 // 24 | 0010011 1000110 | 0010000 1100010 |
| 18. | 7 // 25 | 0010011 1001001 | 0010000 1100100 |
| 19. | 7 // 20 | 0010011 1001010 | 0010000 1101101 |
| 20. | 7 // 27 | 0010011 1001100 | 0010110 1100001 |
| 21. | 7 // 28 | 0010011 1010001 | 0010110 1100010 |
| 22. | 7 // 29 | 0010011 1010010 | 0010110 1100100 |
| 23. | 7 // 30 | 0010011 1010100 | 0010110 1101101 |
| 24. | 7 // 31 | 0010011 1011000 | 0011010 1100001 |
| 25. | 7 // 32 | 0010011 1011011 | 0011010 1100010 |
| 26. | 12 // 1 | 0100000 0000010 | 0100110 1100010 |

TABLE IV D-continued

Substitution encoding table: OO-concatenation for iso-I1 (d=1, k=7) code.

| | OO-indices | original concatenation | substitution |
|---|---|---|---|
| 27. | 12 // 2 | 0100000 0000100 | 0100110 1100100 |
| 28. | 12 // 3 | 0100000 0001000 | 0100110 1101101 |
| 29. | 12 // 4 | 0100000 0001011 | 0101010 1100001 |
| 30. | 12 // 5 | 0100000 0001101 | 0101010 1100010 |
| 31. | 13 // 22 | 0100011 1000011 | 0101010 1100100 |
| 32. | 13 // 23 | 0100011 1000101 | 0101010 1101101 |
| 33. | 13 // 24 | 0100011 1000110 | 0101100 1100001 |
| 34. | 13 // 25 | 0100011 1001001 | 0101100 1100010 |
| 35. | 13 // 20 | 0100011 1001010 | 0101100 1100100 |
| 36. | 13 // 27 | 0100011 1001100 | 0101100 1101101 |
| 37. | 13 // 28 | 0100011 1010001 | 0110010 1100001 |
| 38. | 13 // 29 | 0100011 1010010 | 0110010 1100010 |
| 39. | 13 // 30 | 0100011 1010100 | 0110010 1100100 |
| 40. | 13 // 31 | 0100011 1011000 | 0110010 1101101 |
| 41. | 13 // 32 | 0100011 1011011 | 0110100 1100001 |
| 42. | 22 // 22 | 1000011 1000011 | 1000110 1100010 |
| 43. | 22 // 23 | 1000011 1000101 | 1000110 1100100 |
| 44. | 22 // 24 | 1000011 1000110 | 1001010 1101101 |
| 45. | 22 // 25 | 1000011 1001001 | 1001010 1100001 |
| 46. | 22 // 20 | 1000011 1001010 | 1001010 1100010 |
| 47. | 22 // 27 | 1000011 1001100 | 1001010 1100100 |
| 48. | 22 // 28 | 1000011 1010001 | 1001010 1101101 |
| 49. | 22 // 29 | 1000011 1010010 | 1001100 1100001 |
| 50. | 22 // 30 | 1000011 1010100 | 1001100 1100010 |
| 51. | 22 // 31 | 1000011 1011000 | 1001100 1100100 |
| 52. | 22 // 32 | 1000011 1011011 | 1001100 1101101 |
| 53. | 31 // 1 | 1011000 0000010 | 1010010 1100001 |
| 54. | 32 // 22 | 1011011 1000011 | 1010010 1100010 |
| 55. | 32 // 23 | 1011011 1000101 | 1010010 1100100 |
| 56. | 32 // 24 | 1011011 1000110 | 1010010 1101101 |
| 57. | 32 // 25 | 1011011 1001001 | 1010100 1100001 |
| 58. | 32 // 20 | 1011011 1001010 | 1010100 1100010 |
| 59. | 32 // 27 | 1011011 1001100 | 1010100 1100100 |
| 60. | 32 // 28 | 1011011 1010001 | 1010100 1101101 |
| 61. | 32 // 29 | 1011011 1010010 | 1011000 1100001 |
| 62. | 32 // 30 | 1011011 1010100 | 1011000 1100010 |
| 63. | 32 // 31 | 1011011 1011000 | 1011000 1100100 |
| 64. | 32 // 32 | 1011011 1011011 | 1011000 1101101 |

Next, a rate R=3/5, iso-I2(d=2,k=10) Code is described. This code has a rate between R=1/2 of EFMPlus (d=2,k=10), see document D4 in the list of documents at the end of the description, and R=2/3 of the code disclosed in document D1.

Figure 3:
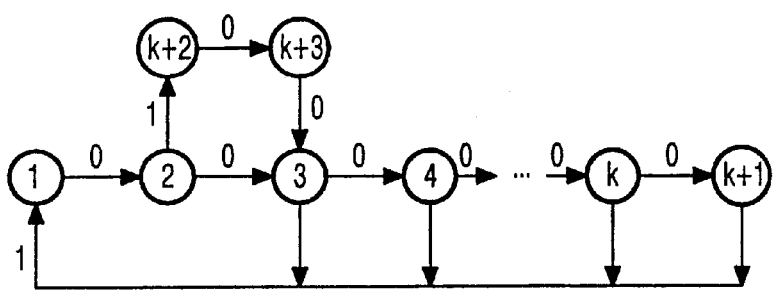
FIG. 3 shows the state-transition diagram for an iso-I2 (d=2,k) code.

The Finite-State Runlength Diagram of the code is shown in FIG. 3. It can be seen that apart from the traditional runlengths I3, I4, ...I(k+1), now also runlengths I2 are allowed, on condition that they are not preceeded nor succeeded by another I2. This is outlined in the finite state runlength diagram by going from state 2 to state k+2, emitting a 1, after which two zeroes are emitted on passing along state k+3 on the way to state 3. Continuing from state 3 on, the minimum runlength is an I3. The capacity of the RLL code (for k=10) equals C=0.646057. The code implementation has a rate R=0.6, thus yielding a code efficiency of 92.9%.

The standard encoding rules are shown in the table V.

TABLE V

Standard encoding rules for iso-I2 (d=2, k=10) code.

| | input word | channel word |
|---|---|---|
| 1. | 000 | 00101 |
| 2. | 011 | 01001 |
| 3. | 101 | 01010 |
| 4. | 110 | 10001 |
| 5. | 001 | 00001 |
| 6. | 010 | 00010 |
| 7. | 100 | 00100 |
| 8. | 111 | 01000 |

Runlength violation problems could arise upon free concatenation of some of the 3-bit input words upon conversion by use of the standard table. Those combinations of 3-bit input words are given in the table VI and the runlength violations are removed by the combinations of 5-bit channel words given in this table VI.

TABLE VI

Substitution encoding table for iso-I2 (d=2, k=10) code.

| | input word | channel word |
|---|---|---|
| 1. | 000 011 | 00101 00000 |
| 2. | 000 101 | 00010 10000 |
| 3. | 000 110 | 00100 10000 |
| 4. | 011 101 | 01001 00000 |
| 5. | 011 110 | 01000 10000 |
| 6. | 101 110 | 01010 00000 |
| 7. | 110 101 | 10010 10010 |
| 8. | 110 110 | 10001 00000 |
| 9. | 000 111 | 00001 00000 |
| 10. | 001 101 | 00010 00000 |
| 11. | 001 110 | 00100 10100 |

It can be summarized that the advantages of the R=3/5 iso-I2(d=2,k=10) code are:
  rate between that of EFMPlus (d=2) and (d=1) codes.
  DC-control via parity preserve principle.
  relatively simple encoding tables.
  A point of attention is that
  standard mapping (3-to-5) and substitutional mapping (6-to-10) are not compatible with byte-oriented error correction. In order to avoid extra error propagation, an error correction code may be devised on formats using 9 bit or 12 bit symbols.

Figure 4:
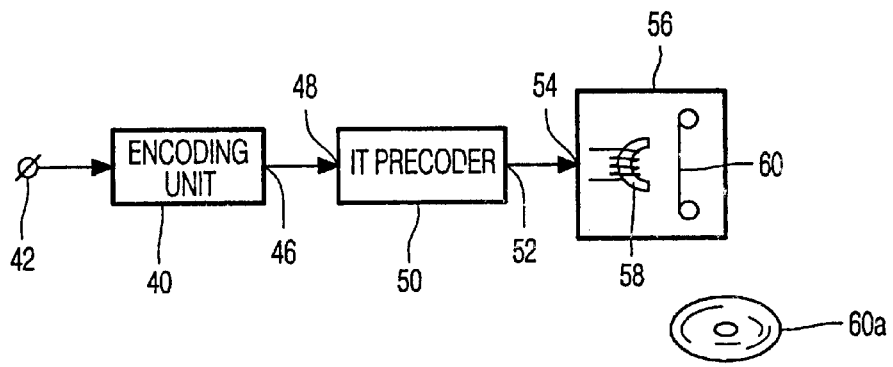
FIG. 4 shows an embodiment of the apparatus in accordance with the invention.
Figure 5:
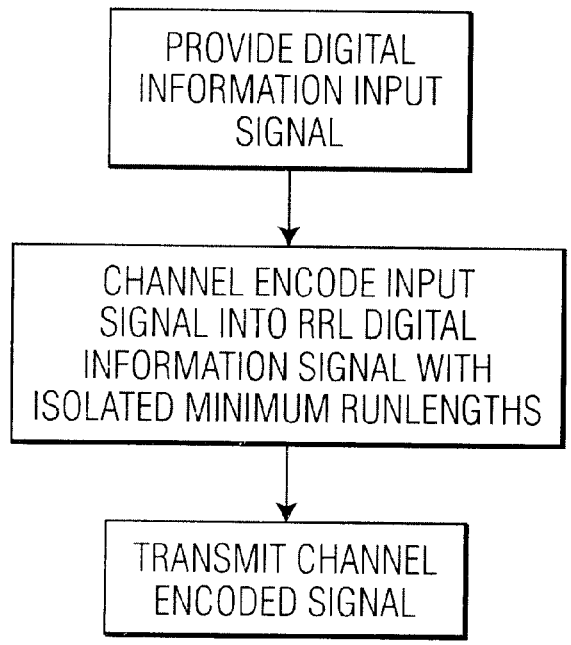
Figure 6:
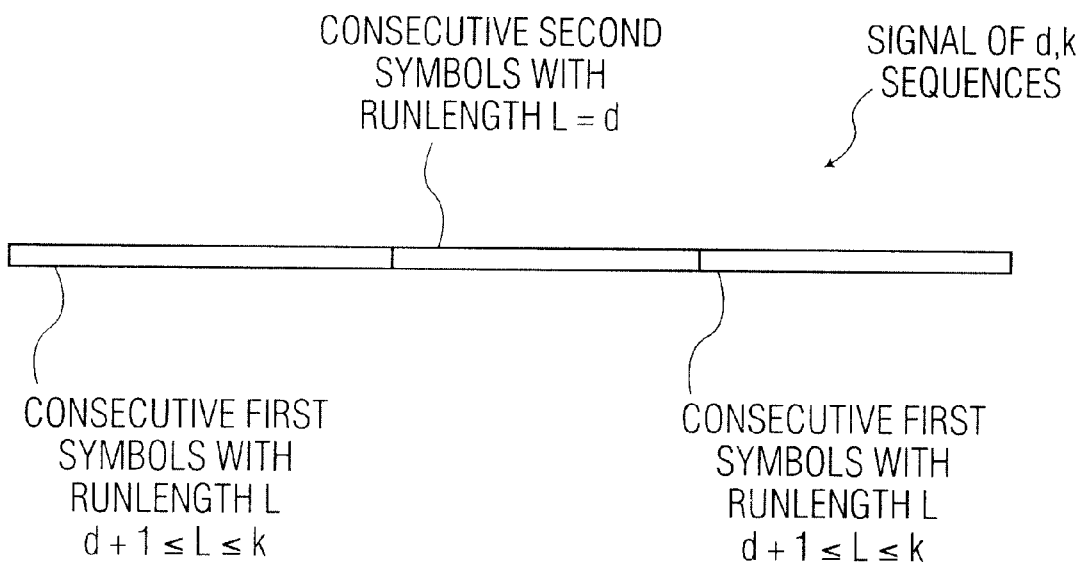

FIG. 4 shows schematically an apparatus for generating one of the (d,k) sequences described above. The apparatus is identified by the encoding unit 40, which has an input 42 for receiving the sequence of input words. The encoding unit 40 converts the sequence of input words into the (d,k) sequence with the properties described above, and supplies the (d,k) sequence to its output 46. The output 46 is coupled to an input 48 of an aT precoder 50, more preferably a 1T precoder, well known in the art. The 1T precoding carried out on the (d,k) sequence, results in a RLL signal of the type (d,k), which is supplied to an output 52. The output 52 is coupled to an input 54 of a writing unit 56 for writing the RLL signal on a record carrier 60, such as a magnetic record carrier eg. in the form of a tape. The writing unit 56 includes at least one write head 58 for realizing this. Instead of a magnetic record carrier, the RLL signal could have been recorded on an optical record carrier, such as an optical disk 60a.

Whilst the invention has been described with reference to preferred embodiments thereof, it is to be understood that these are not limitative examples. Thus, various modifications may become apparent to those skilled in the art, without departing from the scope of the invention, as defined by the claims. As an example. The invention has been explained above with reference to embodiments where binary signals have been encoded and decoded. It will be clear that the invention is equally well applicable on m-ary valued signals, where m is larger than 2.

Further, the invention lies in each and every novel feature and combination of features.

(D1) U.S. Pat. No. 5,477,222 (PHN 14.448)

(D2) K. A. Schouharner Imnnink, Coding Techniques for Digital Recorders, Prentice Hall, 1991.

(D3) P. Funk, Run-Length-Lirnited Codes with Multiple Spacing, IEEE Transactions on Magnetics, Vol. MAG-18, 1982, pp. 772–775.

(D4) U.S. Pat. No. 5,696,505 (PHN 14.746)

What is claimed is:

1. Apparatus comprising:

means for providing an input information signal;

means for converting the input signal into a runlength limited (RLL) digital information signal, the digital information signal having a minimum runlength of d' and a maximum runlength of k', d' and k' being integers larger than zero and k' being larger than d', a minimum runlength in the digital information signal occurs isolated from other minimum runlengths in the digital information signal; and output means for transmitting the RLL digital information signal.

2. The apparatus of claim 1 in which the output means are adapted for recording the RLL digital information signal on a record carrier to transmit the signal.

3. The apparatus of claim 2, in which the output means are adapted to record the (RLL) digital information signal on a magnetic record carrier.

4. The apparatus of claim 2, in which the output means are adapted to record the (RLL) digital information signal on an optical record carrier.

5. Apparatus comprising:

means for providing an input information signal:

means for converting the input signal into a runlength limited (RLL) digital information signal, the digital information signal having a minimum runlength of d' and a maximum runlength of k', d' and k' being integers larger than zero and k' being larger than d', a minimum runlength occurring in the digital information signal follows only a directly preceding runlength larger than d'; and output means for transmitting the RLL digital information signal.

6. The apparatus of claim 5 in which the output means are adapted for recording the RLL digital information signal on a record carrier to transmit the signal.

7. Apparatus comprising:

means for providing an input information signal:

means for converting the input signal into a runlength limited (RLL) digital information signal, the digital information signal having a specific minimum runlength and a maximum runlength of k', the apparatus comprisingmeans for generating runlengths in the digital information signal of length d'+1 at minimum, where d' and k' are integers larger than zero and where k' is larger than d'+1, characterized in that the apparatus, further comprises means for generating runlengths of d' in the RLL digital information signal, such that the runlengths of d' occur isolated from other such runlengths of d' in the digital information signal; and output means for transmitting the RLL digital information signal.

8. The apparatus of claim 7 in which the output means are adapted for recording the RLL digital information signal on a record carrier to transmit the signal.

9. Apparatus comprising:

means for providing an input information signal;

means for converting the input signal into a runlength limited (RLL) digital information signal, the digital information signal having a specific minimum runlength and a maximum runlength of k', the apparatus comprising means for generating runlengths in the digital information signal of length d'+1, where d' and k' are integers larger than zero and where k' is larger than d'+1, characterized in that the apparatus further comprises means for generating runlengths of d' in the RLL digital information signal, such that the runlengths of d' occur only following a directly preceding runlength larger than d'; and output means for transmitting the RLL digital information signal.

10. The apparatus of claim 9 in which the output means are adapted for recording the RLL digital information signal on a record carrier to transmit the signal.

11. A method comprising generating a runlength limited (RLL) digital information signal, the digital information signal having a minimum runlength of d' and a maximum runlength of k', d' and k' being integers larger than zero and k' being larger than d', a minimum runlength in the digital information signal occurs isolated from other minimum runlengths in theadigital information signal.

12. A runlength limited (RLL) digital information signal produced by the method of claim 11.

13. Apparatus including the signal produced by the method of claim 11.

14. The method of claim 13 further comprising the step of recording the RLL digital information signal on a recerd carrier.

15. A method comprising generating a runlength limited (RLL) digital information signal, the digital information signal having aminimum runlength of d' and a maximum runlength of k', d' and k' being integers larger than zero and k' being larger than d', a minimum runlength occurring in the digital information signal follows only a directly preceding runlength larger than d'.

16. The method of claim 15 further comprising the step of recording the RLL digital information signal on a record carrier.

17. A runlength limited (RLL) digital information signal produced by the method of claime 15.

18. Apparatus including the signal produced by the method of claim 15.

19. A method comprising generating a runlength limited; (RLL) digital information signal, the digital information signal having a specific minimum runlength anda maximum runlength of k', the generating including the steps of:

generating runlengths in the digital information signal of length d'+1 at minimum, d' and k' being integers larger than zero and k' being larger than d'+1; and generating runlengths of d' in the RLL digital information signal, such that the runlengths of d' occur isolated from other such runlengths of d' in the digital information signal.

20. The method of claim 19 further comprising the step of recording the RLL digital information signal on a record carrier.

21. A runlength limited (RLL) digital information signal produced by the method of claimbg 19.

22. Apparatus including the signal produced by the method of claim 19.

23. A method comprising generating a runlength limited (RLL) digital information signal, the digital information signal having a specific minimum runlength and a maximum runlength of k', the generating including the steps of:

gererating runlengths in the digital information signal of length d'+1, d' and k' being integers larger than zero and k' being larger than d'+1; and generating runlengths of d' in the RLL digital information signal, such that the runlengths of d' occur only following a directly preceding runlength larger than d'.

24. The method of claim 23 further comprising the step of recording the RLL digital information signal on a record carrier.

25. A runlength limited (RLL) digital information signal produced by the method of claim 23.

26. Apparatus including the signal produced by the method of claim 23.

27. Apparatus comprising:

means for providing an input information signal:

means for converting the input signal into a (d,k) sequence, two logical 'ones' in the sequence being separated by a run of consecutive 'zeros' of at least d, the runs of d consecutive 'zeros' occur isolated from each other in the sequence: and output means for transmitting the (d,k) sequence.

28. A method comprising generating a (d,k) sequence, two logical 'ones' in the sequence being separated by a run of consecutive 'zeros' of at least d runlength, the runs of d consecutive 'zeros' occur isolated from each other in the sequence.

29. A (d,k) sequence producedby the method of claim 28.

30. Apparatus including the (d,k) sequence produced by the method of claim 28.

31. Apparatus comprising:

means for providing an input information signal:

means for converting the input signal into a modified (d,k) sequence, minimum runs of d−1 consecutive 'zeros' between-two subsequent 'ones' are allowed and occur isolated from each other in the modified sequence: and output means for transmitting the modified (d,k) sequence.

32. A method comprising generating a modified (d,k) sequence, minimum runs of d−1 consecutive 'zeros' between two subsequent 'ones' are allowed and occur isolated from each other in the modified sequence.

33. A modified (d,k) sequence produced by the method of claim 32.

34. Apparatus including the modified (d,k ) sequence produced by the method of claim 32.

* * * * *